(12) United States Patent
Chen et al.

(10) Patent No.: US 9,799,753 B2
(45) Date of Patent: Oct. 24, 2017

(54) FINFET HAVING ISOLATION STRUCTURE AND METHOD OF FORMING THE SAME

(71) Applicant: Taiwan Semiconductor Manufacturing Company, Ltd., Hsin-Chu (TW)

(72) Inventors: Chia-Chung Chen, Keelung (TW); Chi-Feng Huang, Zhubei (TW); Victor Chiang Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/274,828

(22) Filed: Sep. 23, 2016

(65) Prior Publication Data
US 2017/0012114 A1    Jan. 12, 2017

Related U.S. Application Data

(60) Division of application No. 14/310,333, filed on Jun. 20, 2014, now Pat. No. 9,478,659, which is a continuation-in-part of application No. 14/060,784, filed on Oct. 23, 2013, now Pat. No. 9,653,542.

(51) Int. Cl.
| H01L 21/84 | (2006.01) |
| H01L 29/66 | (2006.01) |
| H01L 29/78 | (2006.01) |
| H01L 27/108 | (2006.01) |
| H01L 27/12 | (2006.01) |
| H01L 27/092 | (2006.01) |
| H01L 21/8238 | (2006.01) |
| H01L 21/265 | (2006.01) |

(52) U.S. Cl.
CPC .. *H01L 29/66795* (2013.01); *H01L 21/26513* (2013.01); *H01L 21/823821* (2013.01); *H01L 21/845* (2013.01); *H01L 27/0924* (2013.01); *H01L 27/10879* (2013.01); *H01L 27/1211* (2013.01); *H01L 29/66787* (2013.01); *H01L 29/785* (2013.01)

(58) Field of Classification Search
CPC ........... H01L 21/845; H01L 21/823821; H01L 27/0924; H01L 27/1211; H01L 27/10879; H01L 29/66795; H01L 29/66787
See application file for complete search history.

(56) References Cited

U.S. PATENT DOCUMENTS

| 6,525,403 | B2 * | 2/2003 | Inaba | ............... H01L 29/42384 257/329 |
| 7,145,191 | B1 | 12/2006 | Teng et al. | |
| 7,888,734 | B2 | 2/2011 | Chu et al. | |
| 8,889,494 | B2 | 11/2014 | Toh et al. | |
| 2007/0122954 | A1 * | 5/2007 | Liu | ..................... H01L 27/0207 438/187 |

(Continued)

*Primary Examiner* — Phat X Cao
(74) *Attorney, Agent, or Firm* — Slater Matsil, LLP

(57) ABSTRACT

A transistor includes a substrate having an upper surface, a fin structure protruding from the upper surface of the substrate, an isolation structure over the upper surface of the substrate and surrounding a lower portion of the fin structure, and a first doped region at least partially embedded in an upper portion of the fin structure. The fin structure extends along a first direction. The first doped region has a first type doping different from that of the fin structure.

20 Claims, 12 Drawing Sheets

(56) References Cited

U.S. PATENT DOCUMENTS

| | | |
|---|---|---|
| 2010/0052057 A1 | 3/2010 | Chung et al. |
| 2011/0171795 A1 | 7/2011 | Tsai et al. |
| 2012/0112248 A1 | 5/2012 | Wu et al. |
| 2013/0161762 A1 | 6/2013 | Kelly et al. |
| 2013/0181274 A1 | 7/2013 | Saitoh et al. |
| 2014/0035066 A1 | 2/2014 | Tsai et al. |
| 2014/0210009 A1 | 7/2014 | Xiao et al. |
| 2014/0231872 A1 | 8/2014 | Colinge et al. |
| 2014/0308806 A1 | 10/2014 | Chang et al. |
| 2015/0069512 A1 | 3/2015 | Toh et al. |
| 2015/0108581 A1 | 4/2015 | Chen et al. |

\* cited by examiner

9,799,753 B2

FINFET HAVING ISOLATION STRUCTURE AND METHOD OF FORMING THE SAME

PRIORITY CLAIM AND CROSS-REFERENCE

This is a divisional of U.S. application Ser. No. 14/310,333, filed on Jun. 20, 2014, entitled "FinFET Having Isolation Structure and Method of Forming the Same," which is a continuation-in-part of U.S. application Ser. No. 14/060,784 filed on Oct. 23, 2013, which applications are incorporated herein by reference.

BACKGROUND

The semiconductor integrated circuit (IC) industry has experienced rapid growth. Technological advances in IC materials and design have produced generations of ICs, where each generation has smaller and more complex circuits than the previous generation. One strategy that has been employed includes using fin field effect transistors (FinFETs). A FinFET device typically includes a fin structure in which channel and source/drain regions thereof are formed. A gate is formed over the fin structure of the FinFET device. Compared with a planar FET having a comparable size, a FinFET has less short channel effect and greater current capacity, because the FinFET has a greater surface area for forming the channel and source/drain regions.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
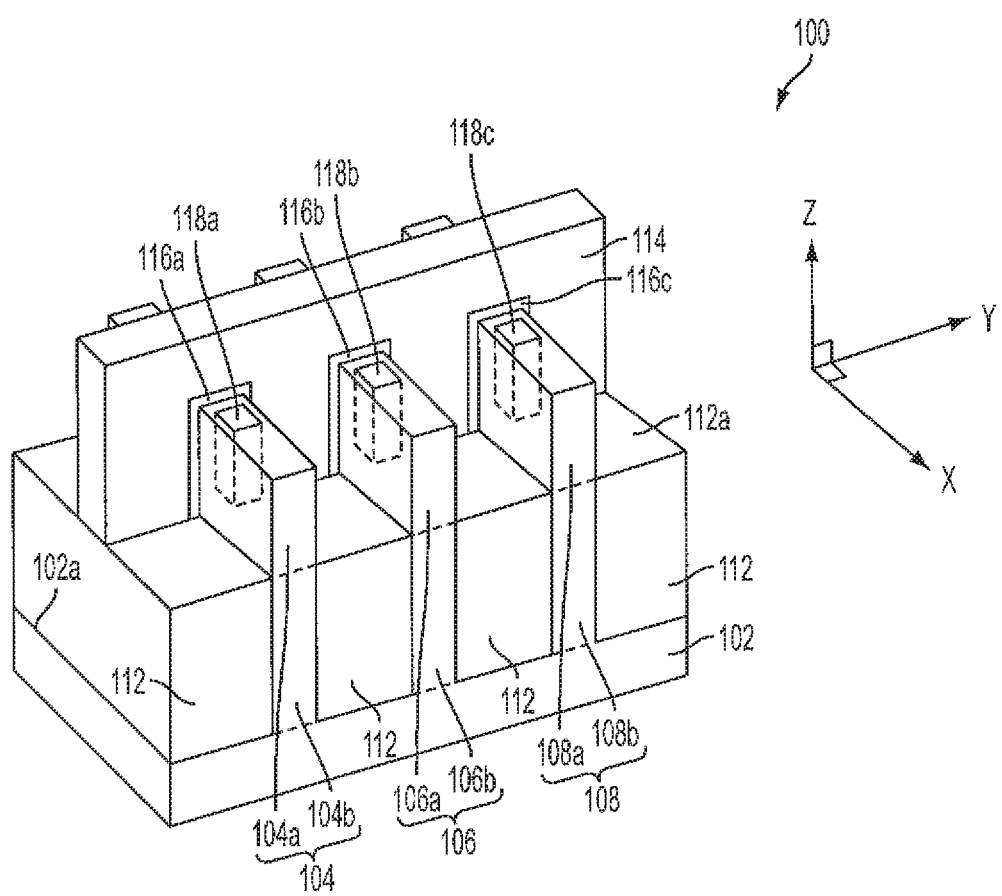
FIG. 1 is a perspective view of a FinFET device in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a perspective view of a FinFET device 100 in accordance with one or more embodiments. FinFET device 100 includes a substrate 102 having an upper surface iota, three fin structures 104, 106, and 108 protruding from upper surface iota of substrate 102, a first isolation structure mover upper surface iota of substrate 102, and a gate electrode 114 over fin structures 104, 106, and 108. Fins structures 104, 106, and 108 extend along a first direction (X direction), and gate electrode 114 extends along a second direction (Y direction) different from the first direction. Fin structures 104, 106, and 108 have upper portions 104a, 106a, and 108a above upper surface 112a of first isolation structure 112 and lower portions 104b, 106b, and 108b below upper surface 112a. Gate electrode 114 and fin structures 104, 106, and 108 define a first set of non-overlapping regions of upper portions 104a, 106a, and 108a on the positive X side of gate electrode 114 and a second set of non-overlapping regions of upper portions 104a, 106a, and 108a on the negative X side of gate electrode 114.

In some embodiments, fin structures 104, 106, and 108 share the same gate electrode 114 and collectively constitute a single transistor device in a circuit schematic. Although three fin structures are depicted in FIG. 1, in some embodiments, a transistor device includes more or less than three fin structures.

First isolation structure 112 surrounds lower portions 104b, 106b, and 108b of fin structures 104, 106, and 108. Gate dielectric layers 116a, 116b, and 116c are between gate electrode 114 and corresponding upper portions 104a, 106a, and 108a of fin structures 104, 106, and 108. FinFET device 100 further includes second isolation structures 118a, 118b, and 118c at least partially embedded in corresponding upper portions 104a, 106a, and 108a of fin structures 104, 106, and 108. In the embodiment depicted in FIG. 1, second isolation structures 118a, 118b, and 118c are embedded in the first set of non-overlapping regions of upper portions 104a, 106a, and 108a on the positive X side of gate electrode 114. Gate electrode 114 and gate dielectric layers 116a, 116b, and 116c are also collectively referred to as a gate structure.

In some embodiments, drain contacts (e.g., element 412 in FIG. 4J and FIG. 4K) are formed in the first set of non-overlapping regions of upper portions 104a, 106a, and 108a on the positive X side of gate electrode 114, and source contacts (e.g., element 414) are formed in the second set of non-overlapping regions of upper portions 104a, 106a, and 108a on the negative X side of gate electrode 114. Compared with a FinFET device without second isolation structures 118a, 118b, and 118c, FinFET device 100 has a higher drain-to-source breakdown voltage. In some embodiments, when a FinFET device fabricated by a predetermined fabrication process has a drain-to-source breakdown voltage of about 1.8 volts (V) or less, FinFET device 100 fabricated by the predetermined fabrication process has a drain-to-source breakdown voltage ranging from about 1.8 V to 10 V.

Figure 2A:
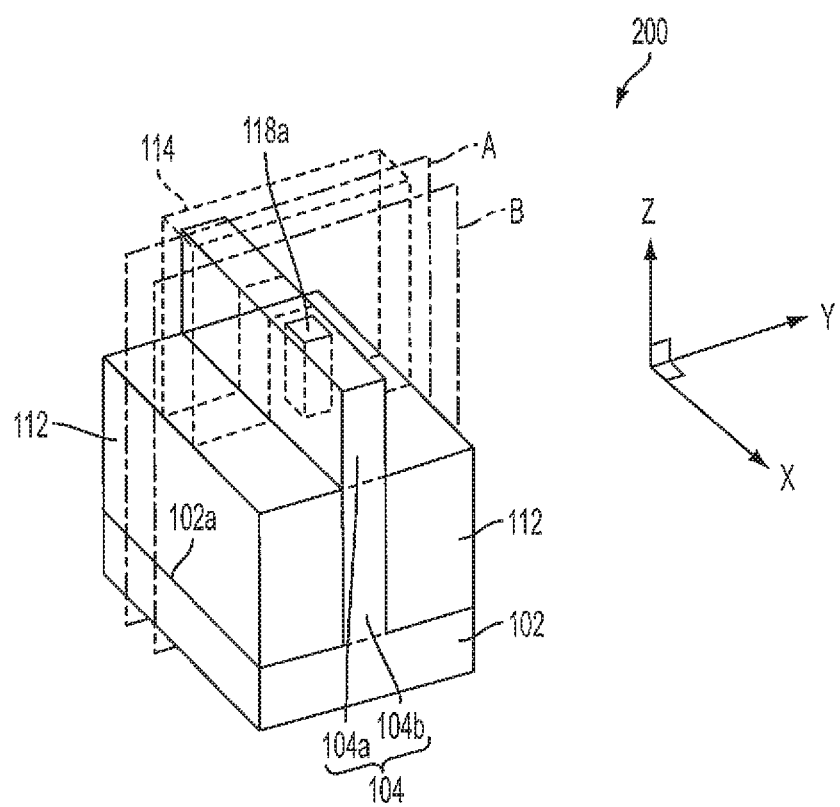
FIG. 2A is a perspective view of a FinFET device having one fin structure in accordance with one or more embodiments.

FIG. 2A is a perspective view of a FinFET device 200 having one fin structure in accordance with one or more embodiments. FinFET device 200 depicts a portion of FinFET device 100. In order to facilitate the understanding of FinFET device 100, gate electrode 214 is depicted with dotted lines in FIG. 2A, and gate dielectric layers 116a, 116b, and 116c are omitted. Components similar to those in FIG. 1 are given the same reference numbers. Two reference planes A and B are defined in FIG. 2A. Reference plane A passes through gate electrode 114 and corresponding structures of FinFET 200 directly under gate electrode 114. Reference plane B passes through second isolation structure 118a. Reference plane A and reference plane B are parallel planes extending in parallel with both Y direction and Z direction.

Figure 2B:
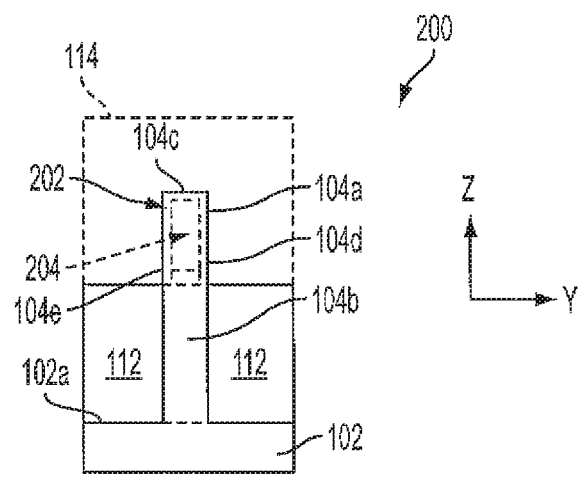
FIG. 2B is a cross-sectional view of the FinFET of FIG. 2A taken along reference plane A in accordance with one or more embodiments.

FIG. 2B is a cross-sectional view of the FinFET 200 of FIG. 2A taken along reference plane A in accordance with one or more embodiments. As depicted in FIG. 2B, upper portion 104a of fin structure 104 has a first doping region 202 extending along an upper surface 104c and sidewalls 104d and 104e of upper portion 104a of fin structure 104. Upper portion 104a of fin structure 104 also has a second doping region 204 further inside the upper portion 104a and separated from upper surface 104c and sidewalls 104d and 104e of upper portion 104a by first doping region 202.

In some embodiments, first doping region 202 has a P-type doping if FinFET 200 is an N-type transistor and has an N-type doping if FinFET 200 is a P-type transistor. In some embodiments, second doping region 204 includes a doping type different from that of first doping region 202. In some embodiments, second doping region 204 is omitted. In some embodiments, a portion of second doping region 204 that is directly under the gate electrode 114, such as region 204 in FIG. 2B, is omitted.

Figure 2C:
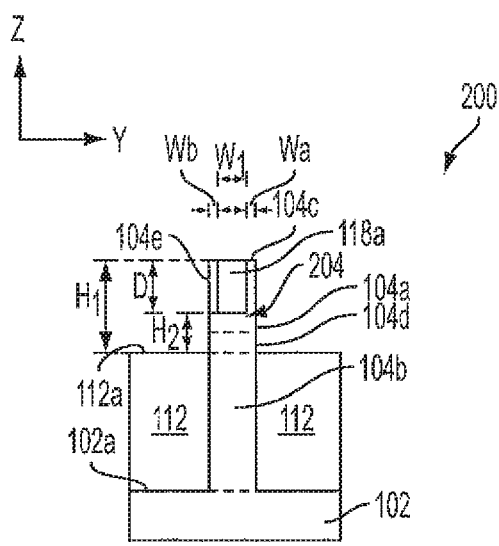
FIG. 2C is a cross-sectional view of the FinFET of FIG. 2A taken along reference plane B in accordance with one or more embodiments.

FIG. 2C is a cross-sectional view of the FinFET 200 of FIG. 2A taken along reference plane B in accordance with one or more embodiments. First doping region 202 does not extend beyond gate electrode 114, and thus is not shown in FIG. 2C. Upper portion 104a of fin structure 104 has a height H1 above upper surface 112a of first isolation structure 112. In some embodiments, height H1 ranges from 100 nanometers (nm) to 500 nm. Second isolation structure 118a and upper surface 112a of first isolation structure 112 are vertically separated by a distance H2. In some embodiments, distance H2 is equal to or less than 450 nm. In some embodiments, a lower surface of second isolation structure 118a is level with upper surface 112a, and distance H2 is thus equal to 0 nm. In other words, second isolation structure 118a has a depth D measurable from upper surface 104c of fin structure 104. In some embodiments, a ratio of depth D to height H1 ranges from 10% to 50%.

Second isolation structure 118a has a width W1 measurable along Y direction. In some embodiments, width W1 ranges from 5 nm to 50 nm. Second isolation structure 118a and sidewalls 104d and 104e of upper portion 104a of fin structure 104 are horizontally separated by distances Wa and Wb. In some embodiments, Wa and Wb ranges from 5 nm to 10 nm.

Figure 2D:
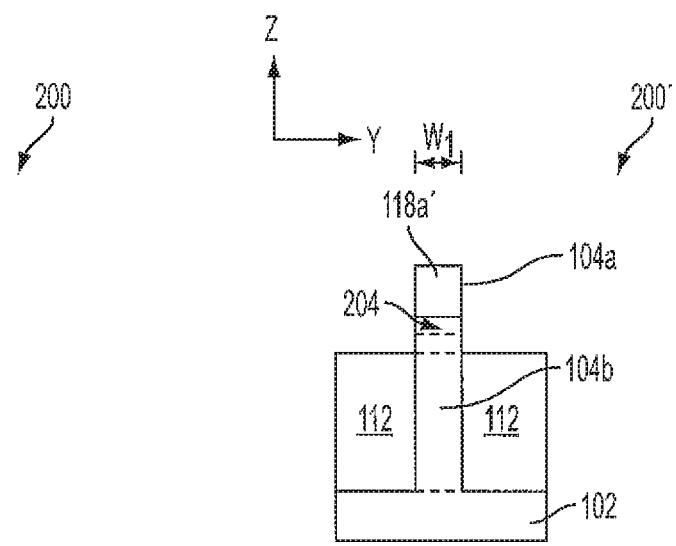
FIG. 2D is a cross-sectional view of the FinFET of FIG. 2A taken along reference plane B in accordance with some other embodiments.

FIG. 2D is a cross-sectional view of the FinFET of FIG. 2A taken along reference plane B in accordance with some other embodiments. In some embodiments, FinFET 200' includes second isolation structure 118a' extending through an entire width of upper portion 104a of fin structure 104. Therefore, in the embodiment depicted in FIG. 2D, Wa and Wb equal to 0 nm.

Figure 2E:
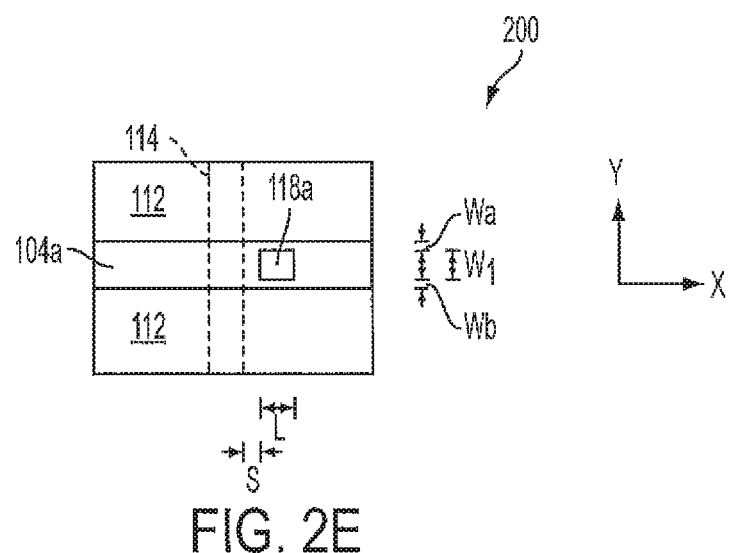
FIG. 2E is a top view of the FinFET of FIG. 2A in accordance with one or more embodiments.

FIG. 2E is a top view of the FinFET 200 of FIG. 2A in accordance with one or more embodiments. Second isolation structure 118a has a length L defined along direction X. In some embodiments, length L ranges from 10 nm to 100 nm. Second isolation structure 118a is horizontally separated from gate electrode 114 by a distance S. In some embodiments, distance S ranges from 20 nm to 60 nm.

Figure 2F:
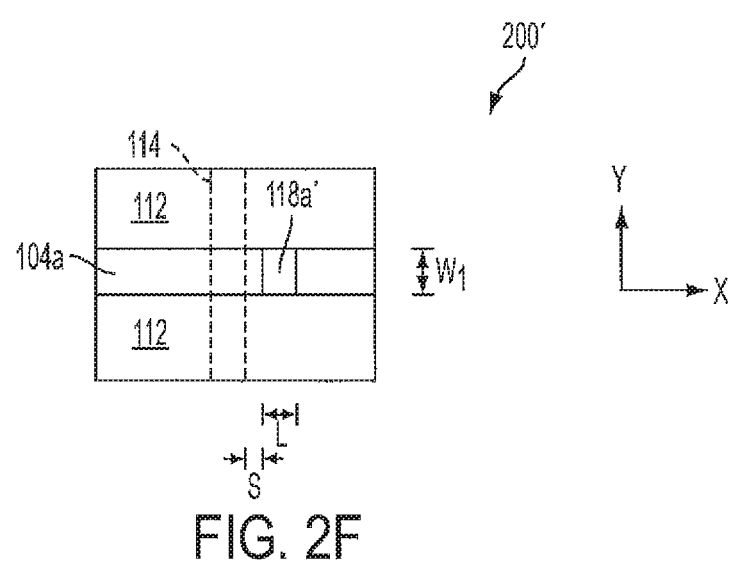
FIG. 2F is a top view of the FinFET of FIG. 2D in accordance with one or more embodiments.

FIG. 2F is a top view of the FinFET 200' of FIG. 2D in accordance with one or more embodiments. As depicted in FIGS. 2D and 2F, in some embodiments, FinFET 200' includes second isolation structure 118a' extending through the entire width of upper portion 104a of fin structure 104. Therefore, in the embodiment depicted in FIGS. 2D and 2F, Wa and Wb equal to 0 nm.

Figure 3:
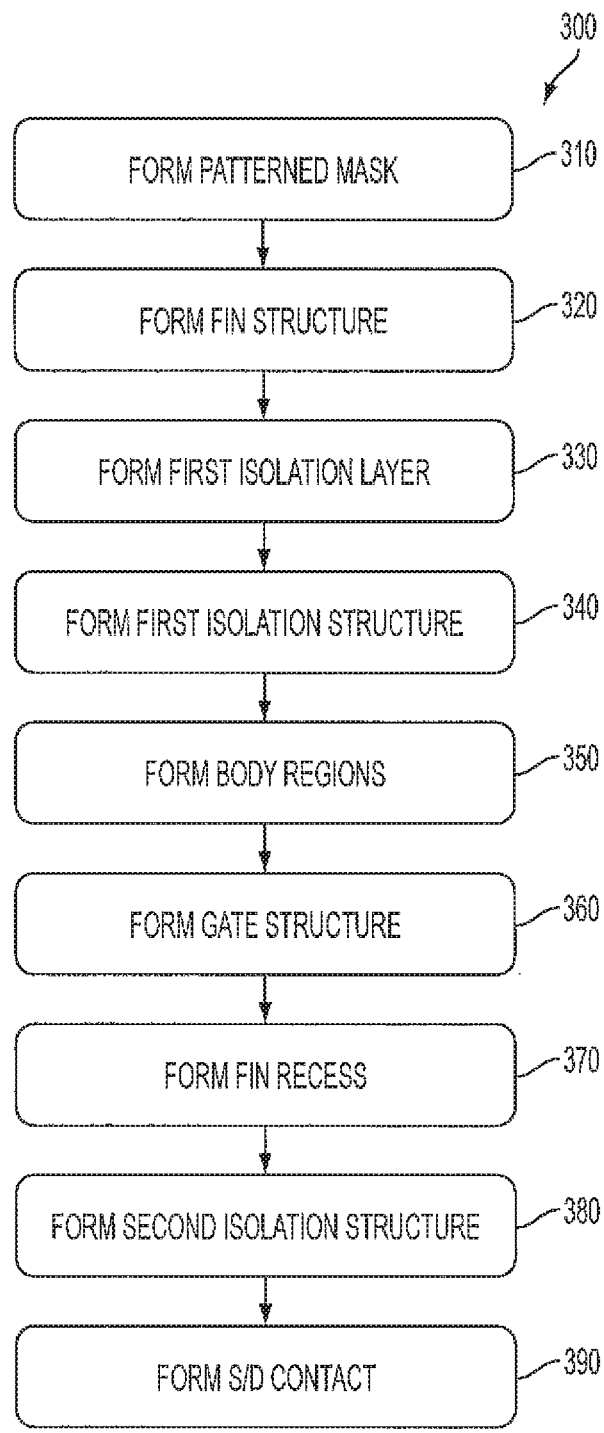
FIG. 3 is a flowchart of a method of fabricating the FinFET of FIG. 2A in accordance with one or more embodiments.

FIG. 3 is a flowchart of a method 300 of fabricating the FinFET of FIG. 2A in accordance with one or more embodiments. It is understood that additional operations may be performed before, during, and/or after the method 300 depicted in FIG. 3, and that some other processes may only be briefly described herein.

Figure 4A:
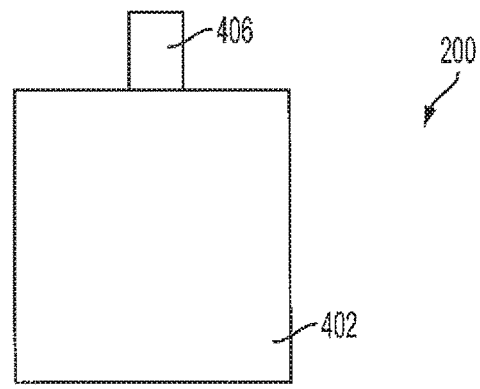
FIGS. 4A-4I are cross-sectional views of the FinFET of FIG. 2A taken along reference plane A or reference plane B at various stage of fabrication in accordance with one or more embodiments.
Figure 4B:
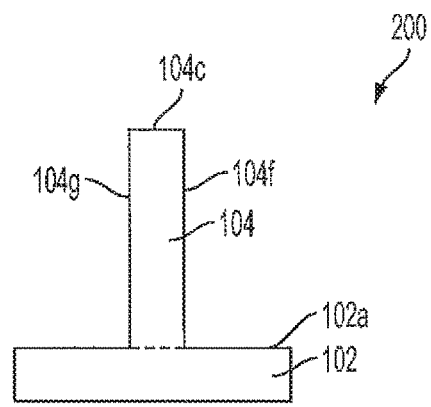
Figure 4C:
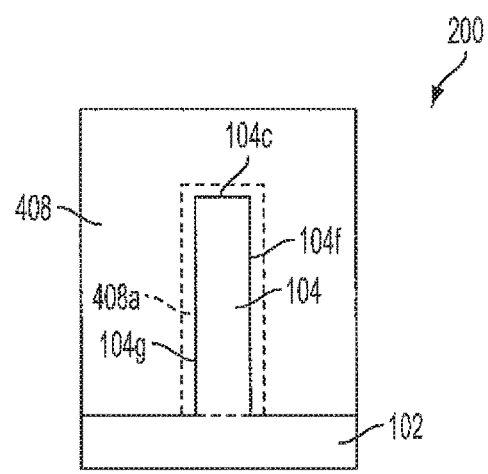
Figure 4D:
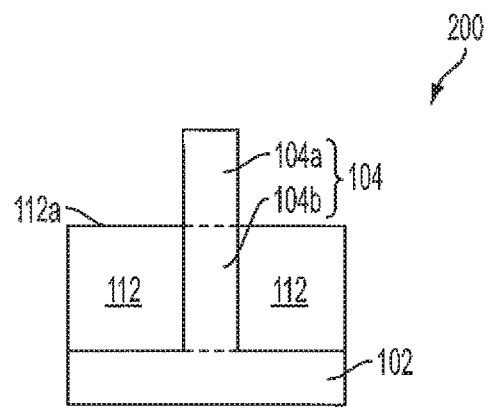
Figure 4E:
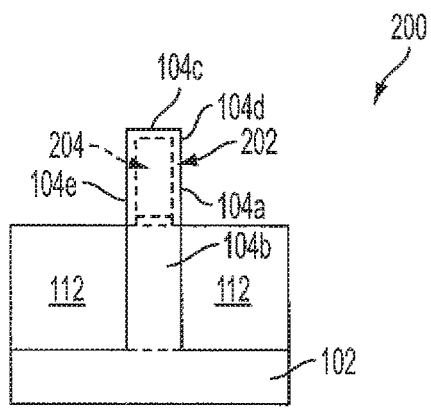
Figure 4F:
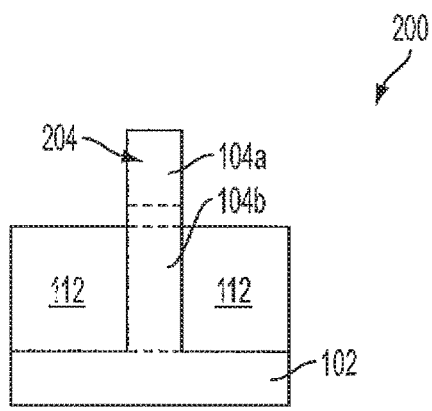
Figure 4G:
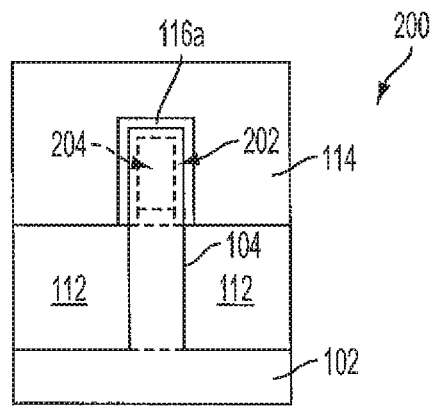
Figure 4H:
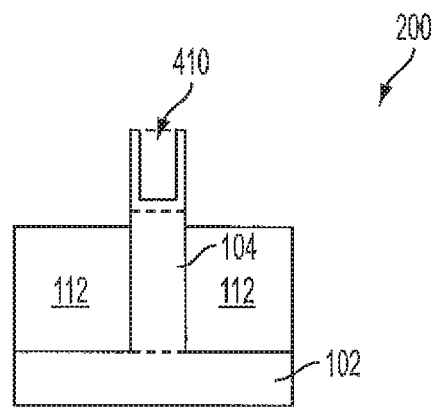
Figure 4I:
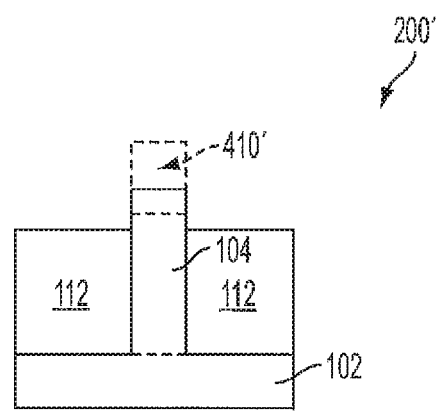
Figure 4J:
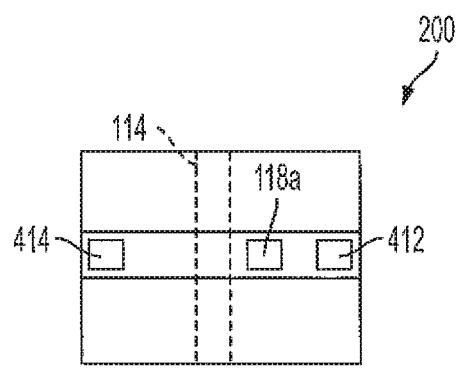
FIGS. 4J-4K are top views of the FinFET of FIG. 2A in accordance with one or more embodiments.

FIGS. 4A-4H are cross-sectional views of the FinFET of FIG. 2A taken along reference plane A or reference plane B at various stage of fabrication in accordance with one or more embodiments. FIGS. 4I-4J are top views of the FinFET of FIG. 2A in accordance with one or more embodiments. Components in FIGS. 4A-4J that are similar or the same to those in FIGS. 2A-2F are given the same reference numbers.

As depicted in FIG. 3, in operation 310, a patterned mask is formed on a substrate. FIG. 4A is a cross-sectional view of the FinFET 200 of FIG. 2A taken along reference plane A or reference plane B after completion of operation 310 in accordance with one or more embodiments. FinFET 200 includes a substrate 402 and a patterned mask 406 formed over substrate 402.

In some embodiments, patterned mask 406 is formed by forming a hard mask layer on substrate 402 and then patterning a hard mask layer. In some embodiments, the hard mask layer includes one or more layers of silicon oxide or silicon nitride. In at least one embodiment, the hard mask layer includes a silicon oxide layer (also referred to as pad oxide layer in some applications) and a silicon nitride layer over the pad oxide layer. In some embodiments, formation of patterned mask 406 includes first forming polysilicon dummy structures over the hard mask layer, forming silicon nitride spacers on sidewalls of the dummy structures, removing the dummy structures, and patterning the hard mask layer to become patterned mask 406 using the silicon nitride spacers as a mask.

In some embodiments, substrate 402 is a silicon substrate or a silicon-on-insulator (SOI) substrate.

As depicted in FIG. 3, in operation 320, a fin structure is formed over the substrate. FIG. 4B is a cross-sectional view of the FinFET of FIG. 2A taken along reference plane A or reference plane B after completion of operation 320 in accordance with one or more embodiments. FinFET 200 includes a substrate 102 and a fin structure 104 protruding from an upper surface 102a of substrate 102. Fin structure 104 has upper surface 104c and sidewalls 104f and 104g.

In some embodiments, fin structure 104a and substrate 102 are formed by etching a portion of substrate 402 not protected by patterned mask 406. In some embodiments, etching substrate 402 includes performing a dry etch process. In some embodiments, the dry etch process is performed under a source power of about 500 to 700 W, a bias power of about 50 to 70 W, and a pressure of about 1 to 10 mTorr, using $CH_2F_2$, $SF_6$, $N_2$, or He as etching gases.

In some other embodiments, fin structure 104 is epitaxially grown from exposed substrate 402. Therefore, substrate 402 is substantially identical to substrate 102.

In some embodiments after the formation of fin structure 104, a removal process is performed to remove patterned mask 406 and a cleaning process is performed to clean the resulting structure depicted in FIG. 4B. In some embodiments, the cleaning process includes performing a polymer wet dip process.

As depicted in FIG. 3, in operation 330, a first isolation layer is formed over the substrate. FIG. 4C is a cross-sectional view of the FinFET of FIG. 2A taken along reference plane A or reference plane B after completion of operation 330 in accordance with one or more embodiments. FinFET 200 includes a first isolation layer 408 over substrate 102 and fin structure 104.

In some embodiments, formation of first isolation layer 408 includes performing a chemical vapor deposition (CVD) process. In some embodiments, prior to performing the CVD process, a liner layer 408a is formed on sidewalls 104f and 104g and upper surface 104c of fin structure 104. In some embodiments, after performing the CVD process, a chemical-mechanical planarization process is performed to expose the upper surface of fin structure 104.

In some embodiments, liner layer 408a has a material the same as first isolation layer 408. In some embodiments, liner layer 408a and first isolation layer include silicon oxide. In some embodiments, liner layer 408a has a material including silicon oxide or silicon nitride. In some embodiments, liner layer 408a is formed by performing a thermal oxidation process or another CVD process. In some embodiments, liner layer 408a may have a thickness of about 100 to 1000 Å. In some embodiments, liner layer 408a is provided for reducing damage on the surfaces of fin structure 104. In some embodiments, liner layer 408a is omitted.

In some embodiments, the CVD process for forming a majority of first isolation layer 408 includes a high density plasma (HDP) CVD process or a sub-atmospheric CVD (SACVD). In some embodiments, the HDP CVD process is performed under a low frequency power less than 5000 W, a high frequency power less than 3500 W, a pressure less than 10 mTorr, and a temperature of about 500 to 1000° C., using silane and oxygen as reacting precursors.

As depicted in FIG. 3, in operation 340, a first isolation structure is formed over the substrate. FIG. 4D is a cross-sectional view of the FinFET of FIG. 2A taken along reference plane A or reference plane B after completion of operation 340 in accordance with one or more embodiments. FinFET 200 includes a first isolation structure 112 over substrate 102 and surrounding a lower portion 104b of fin structure 104. First isolation structure 112 has an upper surface 112a, and upper surface 112a divided fin structure 104 into upper portion 104a and lower portion 104b.

In some embodiments, first isolation structure 112 is formed by recessing first isolation layer 408. In some embodiments, the recessing first isolation layer 408 includes performing a dry etch process or a wet etch process. In some embodiments, the dry etch process is performed using a plasma including tetrafluormethane ($CF_4$) and/or trifluormethane ($CHF_3$). In some embodiments, the wet etch process includes dipping the manufacture 200 in hydrofluoric (HF).

As depicted in FIG. 3, in operation 350, a body region is formed in the upper portion of the fin structure. FIG. 4E is a cross-sectional view of the FinFET of FIG. 2A taken along reference plane A after completion of operation 350 in accordance with one or more embodiments. FIG. 4F is a cross-sectional view of the FinFET of FIG. 2A taken along reference plane B after completion of operation 350 in accordance with one or more embodiments. In a region of upper portion 104a of fin structure 104 that is going to be directly under gate electrode 114, a first doping region 202 is formed as a body region of FinFET 200 along an upper surface 104c and sidewalls 104d and 104e of upper portion 104a of fin structure 104. In some embodiments, a second doping region 204 is formed further inside the upper portion 104a. Second doping region 204 further extends to non-overlapping regions of upper portion 104a of fin structure 104 that is not going to be directly under gate electrode 114. In some embodiments, second doping region 204 is formed in another operation before or after operation 350. In some embodiments, second doping region 204 is omitted. In some embodiments, a portion of second doping region 204 under the gate electrode 114, such as region 204 in FIG. 4E, is omitted.

In some embodiments, first doping region 202 has a P-type doping if FinFET 200 is an N-type transistor and has an N-type doping if FinFET 200 is a P-type transistor. In some embodiments, second doping region 204 includes a doping type different from that of first doping region 202.

As depicted in FIG. 3, in operation 360, a gate structure is formed over the substrate and the fin structure. FIG. 4G is a cross-sectional view of the FinFET of FIG. 2A taken along reference plane A after completion of operation 360 in accordance with one or more embodiments. FinFET 200 includes a gate structure having a gate electrode 114 over fin structure 104 and a gate dielectric layer 116a between gate electrode 114 and upper portion 104a of fin structure 104.

In some embodiments, gate electrode 114 comprises a material including polysilicon or metal. In some embodiments, gate dielectric layer 116a includes a material including silicon oxide or a dielectric material having a dielectric constant greater than that of silicon oxide.

As depicted in FIG. 3, in operation 370, a recess in the fin structure is formed. FIG. 4H is a cross-sectional view of the FinFET of FIG. 2A taken along reference plane B after completion of operation 370 in accordance with one or more embodiments. FinFET 200 has a recess 410 defined in upper portion 104a of fin structure 104. FIG. 4I is a cross-sectional view of the FinFET of FIG. 2A taken along reference plane B after completion of operation 370 in accordance with some other embodiments. In some embodiments, FinFET 200' has a recess 410' extending through the entire width of upper portion 104a of fin structure 104.

In some embodiments, recess 410 or 410' is formed by forming another patterned mask, such as a patterned photoresist structure, over fin structure 104 and then performing a dry etch process similar to the dry etch process performed in operation 320.

As depicted in FIG. 3, in operation 380, a second isolation structure is formed at least partially in the recess in the fin structure. FIG. 2C depicts a cross-sectional view of FinFET 200 taken along reference plane B after completion of operation 380 in accordance with one or more embodiments.

FIG. 2D depicts a cross-sectional view of FinFET 200' taken along reference plane B after completion of operation 380 in accordance with one or more embodiments.

In some embodiments, the formation of second isolation structure 118a or 118a' includes filing recess 410 or 410' by a dielectric material by a CVD process. In some embodiments, forming second isolation structure 118a or 118a' includes forming a second isolation layer by a CVD process similar to that of operation 330 and then performing a dry etch process or a wet etch process similar to that of operation 340 to remove a portion of the second isolation layer that is above upper surface 104c of fin structure 104.

Figure 4K:
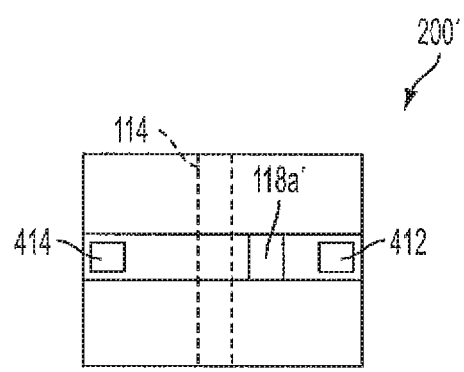

As depicted in FIG. 3, in operation 390, source and drain contacts are formed in the fin structure. FIG. 4J is a top view of FinFET 200 after completion of operation 390 in accordance with one or more embodiments. FIG. 4K is a top view of FinFET 200' after completion of operation 390 in accordance with one or more embodiments.

In some embodiments, a first contact region 412 is formed in a non-overlapping region of upper portion 104a of fin structure 104 on one side of the gate electrode 114. In some embodiments, a second contact region 414 is formed in another non-overlapping region of upper portion 104a of fin structure 104 on the other side of the gate electrode 114. In some embodiments, first contact region 412 and second isolation structure 118a are on the same side of the gate electrode 114. In some embodiments, first contact region 412 is used as a drain contact region of FinFET 200 or FinFET 200', and the corresponding non-overlapping region of upper portion 104a of fin structure 104 is also referred to as drain region. In some embodiments, second contact region 414 is used as a source contact region of FinFET 200 or FinFET 200', and the corresponding non-overlapping region of upper portion 104a of fin structure 104 is also referred to as source region.

Figure 5A:
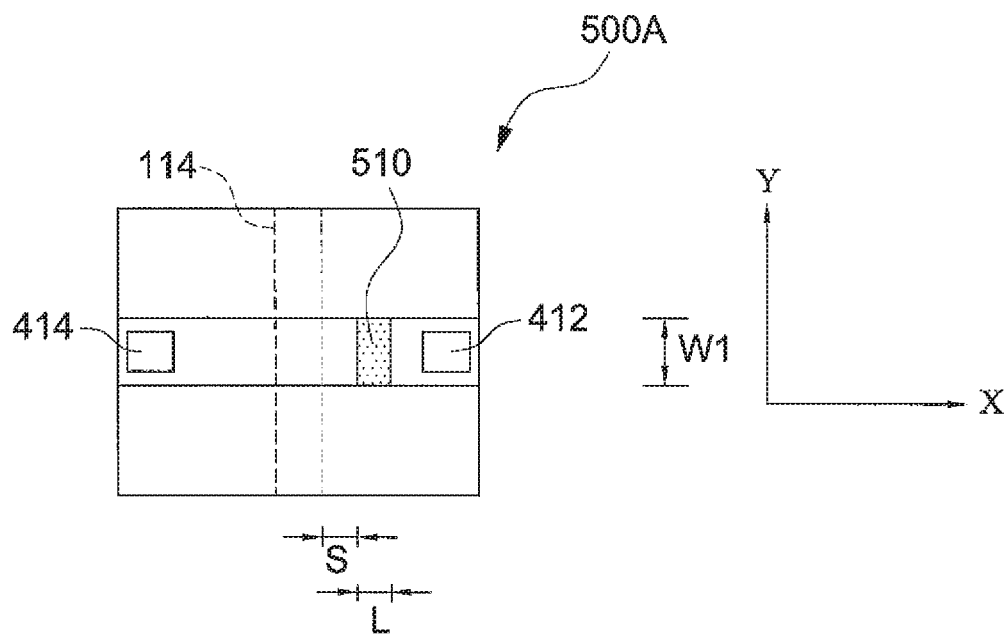
FIG. 5A is a top view of a FinFET in accordance with one or more embodiments.

FIG. 5A is a top view of a FinFET 500A in accordance with one or more embodiments. Components in FIG. 5A that are the same or similar to those in FIGS. 2A-2F and 4A-4K are given the same reference numbers, and detailed description thereof is omitted. Compared with FinFET 200 or FinFET 200', FinFET 500A uses an N-type doped region 510 in place of second isolation structure 118a or 118a'. N-type doped region 510 is at least partially embedded in the upper portion 104a of the fin structure 104. A drain contact region 412 is in the upper portion 104a not covered by gate electrode 114, and N-type doped region 510 is between the drain contact region 412 and the gate electrode 114. The dimension and position of N-type doped region 510 is consistent with those of second isolation structure 118a or 118a' illustrated above.

In some embodiments, substrate 102 and fin structure 104 are doped with P-type dopant. In some embodiments, N-type doped region 510 has a dopant concentration ranging from $10^{10}$ to $10^{12}$ cm$^{-3}$.

Figure 5B:
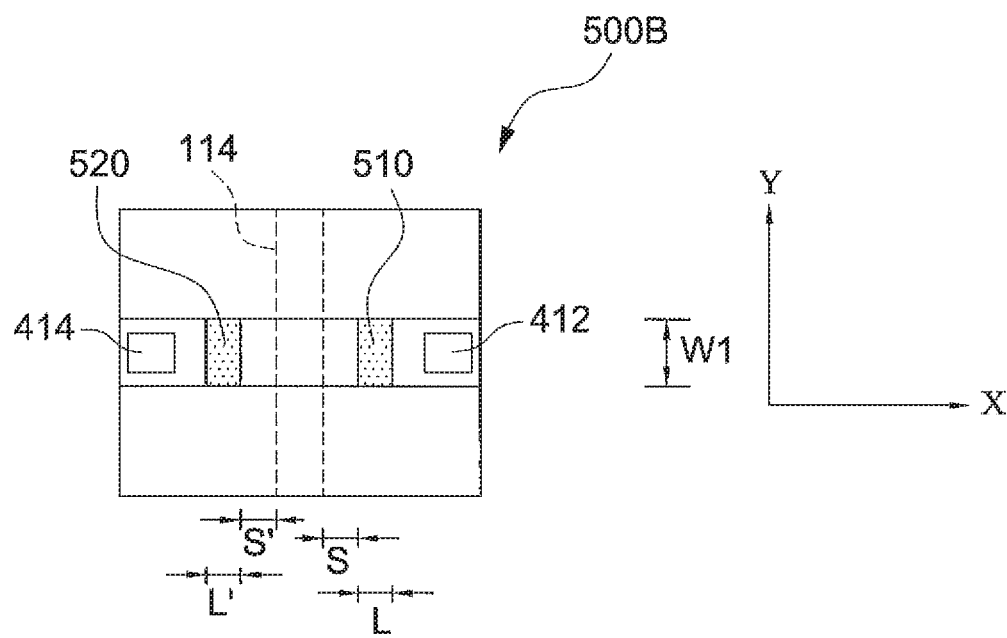
FIG. 5B is a top view of another FinFET in accordance with one or more embodiments.

FIG. 5B is a top view of another FinFET 500B in accordance with one or more embodiments. Components in FIG. 5B that are the same or similar to those in FIG. 5A are given the same reference numbers, and detailed description thereof is omitted. Compared with FinFET 500A, FinFET 500B further includes a P-type doped region 520 at least partially embedded in in the upper portion 104a not covered by gate electrode 114. N-type doped region 510 and P-type doped region 520 are at opposite sides of the gate electrode 114. A source contact region 414 is in the upper portion 104a not covered by gate electrode 114, and P-type doped region 520 is between the source contact region 414 and the gate electrode 114.

In some embodiments, P-type doped region 520 has a dopant concentration greater than that of the fin structure 104.

P-type doped region 520 has a length L' defined along direction X. In some embodiments, length L' ranges from 10 nm to 100 nm. P-type doped region 520 is horizontally separated from gate electrode 114 by a distance S'. In some embodiments, distance S' ranges from 20 nm to 60 nm. In some embodiments, the dimension and position of P-type doped region 520 is consistent with those of second isolation structure 118a or 118a' illustrated above, except P-type doped region 520 is disposed at the source side of fin structure 104.

Figure 6:
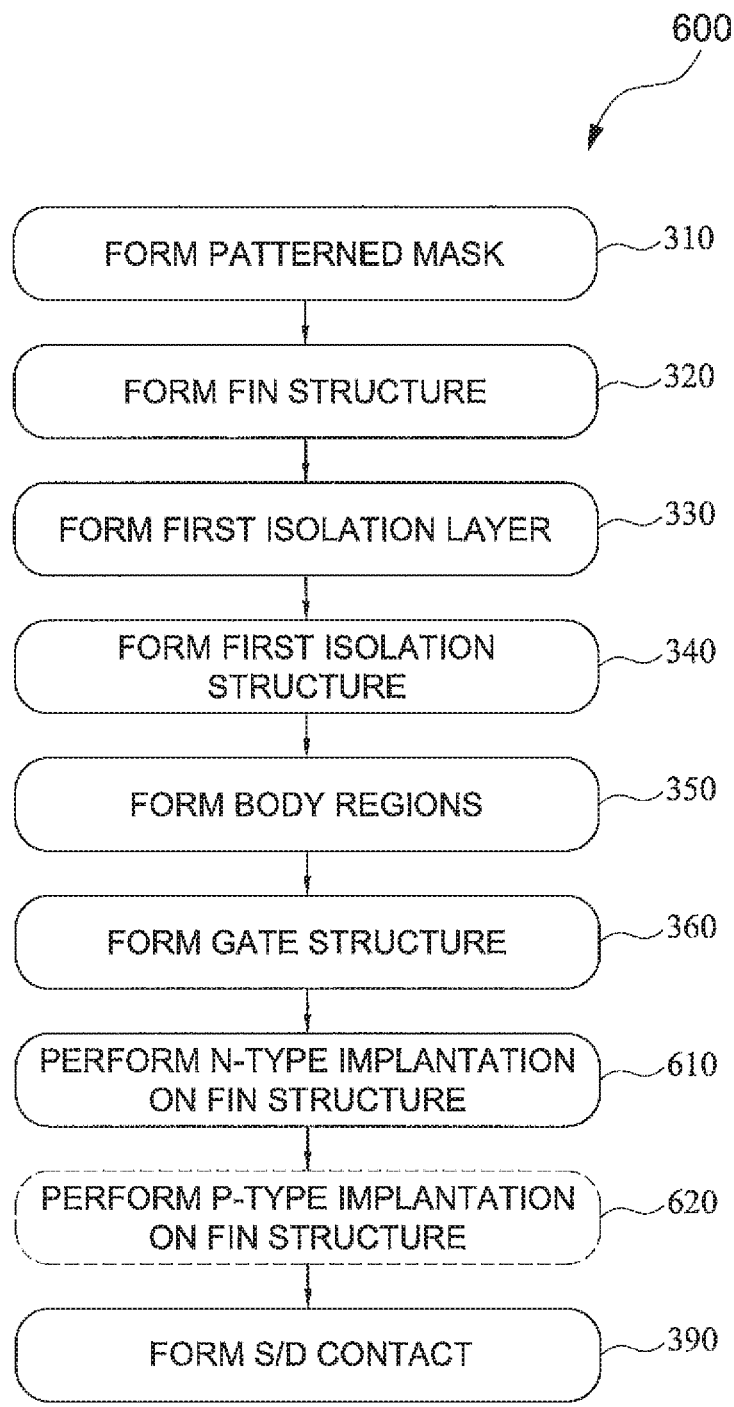
FIG. 6 is a flowchart of a method of fabricating a FinFET in accordance with one or more embodiments.

FIG. 6 is a flowchart of a method 600 of fabricating a FinFET in accordance with one or more embodiments. The operations in FIG. 6 that are the same or similar to those in FIG. 3 are given the same reference numbers, and the detailed description thereof is thus omitted. It is understood that additional operations may be performed before, during, and/or after the method 600 depicted in FIG. 6, and that some other processes may only be briefly described herein.

Figure 7A:
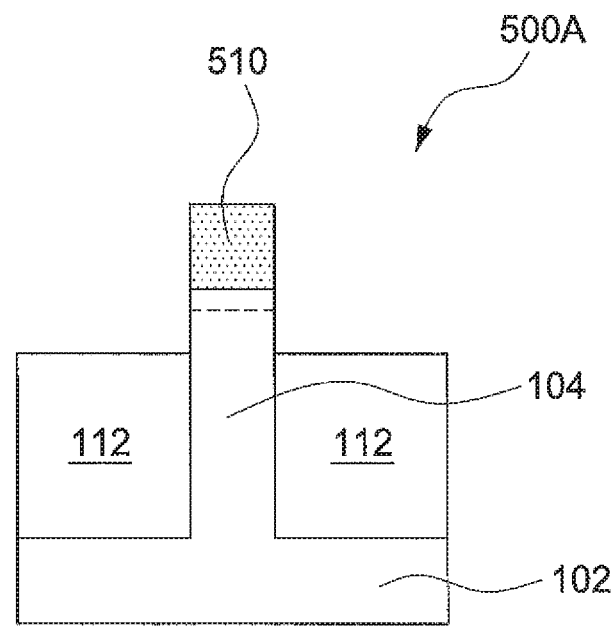
FIG. 7A is a cross-sectional view of a FinFET in accordance with one or more embodiments.

As depicted in FIG. 6, after operation 360, the process proceeds to operation 610. In operation 610, an N-type ion implantation process is performed in the drain region of the fin structure 104 to form N-type doped region 510. In some embodiments, the N-type ion implantation process includes implanting N-type dopants and using a patterned photoresist structure as a mask. FIG. 7A is a cross-sectional view of a FinFET, such as FinFET 500A, at one of various stages of fabrication in accordance with one or more embodiments. FIG. 7A is a cross-sectional view of FinFET 500A taken along a reference plane passing through N-type doped region 510 after completion of operation 610.

Figure 7B:
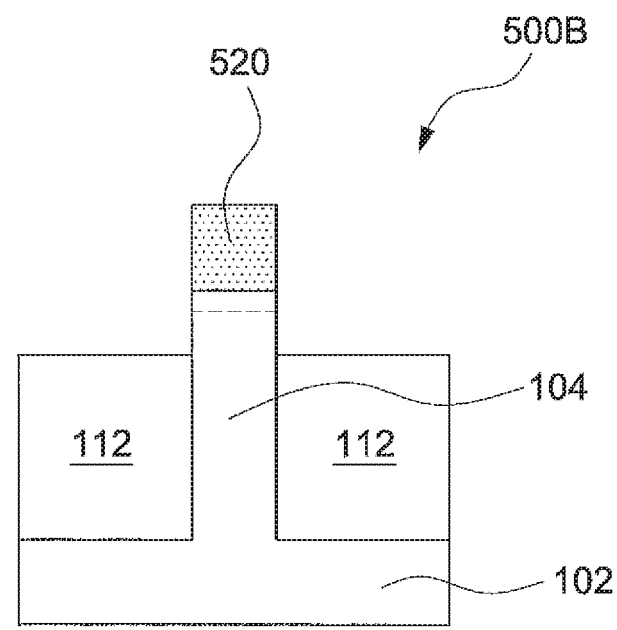
FIG. 7B is a cross-sectional view of another FinFET in accordance with one or more embodiments.

After operation 610, the process proceeds to operation 620, where a P-type ion implantation process is performed in the source region of the fin structure 104 to form P-type doped region 520. In some embodiments, the P-type ion implantation process includes implanting P-type dopants and using a patterned photoresist structure as a mask. FIG. 7B is a cross-sectional view of another FinFET, such as FinFET 500B, at one of various stages of fabrication in accordance with one or more embodiments. FIG. 7B is a cross-sectional view of FinFET 500B taken along a reference plane passing through P-type doped region 520 after completion of operation 620. In some embodiments, if FinFET 500A is to be fabricated instead of FinFET 500B, operation 620 is omitted. Afterward, the process proceeds to operation 390 as illustrated in conjunction with FIG. 3.

In accordance with one embodiment, a transistor includes a substrate having an upper surface, a fin structure protruding from the upper surface of the substrate, an isolation structure over the upper surface of the substrate and surrounding a lower portion of the fin structure, and a first doped region at least partially embedded in an upper portion of the fin structure. The fin structure extends along a first direction. The first doped region has a first type doping different from that of the fin structure.

In accordance with another embodiment, a method of making a transistor includes forming a fin structure protruding from an upper surface of a substrate. The fin structure extends along a first direction and includes a lower portion and an upper portion. An isolation structure is formed over the upper surface of the substrate and surrounding the lower portion of the fin structure. A first doped region is formed in a portion of the upper portion of the fin structure. The first doped region has a first type doping different from that of the fin structure.

In accordance with another embodiment, a method of making a transistor includes forming a fin structure protruding from an upper surface of a substrate. The fin structure includes a lower portion and an upper portion. A gate structure is formed over the fin structure. The gate structure and the fin structure define a drain region in the upper portion of the fin structure and a source region in the upper portion of the fin structure. A first ion implantation process is performed on the drain region of the fin structure to form a first doped region. A drain contact region is formed in the drain region of the fin structure. The first doped region is between the drain contact region and the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a transistor, comprising:
   forming a fin structure over a substrate, wherein the fin structure protrudes above upper surfaces of isolations structures on opposing sides of the fin structure, wherein the fin structure has a source region, a drain region, and a channel region, the channel region being disposed between the source region and the drain region;
   doping the source region and the drain region using a first type of doping, wherein the source region and the drain region extend from an uppermost surface of the fin structure into the fin structure;
   doping exterior portions of the channel region using a second type of doping different from the first type of doping, wherein the exterior portions comprise portions of the channel region along an upper surface of the fin structure in the channel region and portions of the channel region along sidewalls of the fin structure in the channel region;
   forming a gate structure over the channel region of the fin structure, wherein the source region and the drain region extend to opposing sides of the gate structure;
   forming a first doped region in the drain region, wherein the first doped region has the second type of doping; and
   forming a drain contact to the drain region, wherein the drain contact is disposed over the uppermost surface of the fin structure and contacts the drain region, wherein the drain region encircles the drain contact in a plan view, wherein the first doped region is disposed between the gate structure and the drain contact, wherein a first portion of the drain region contacting the first doped region and a second portion of the drain region contacting the drain contact have a same dopant concentration of the first type of doping.

2. The method of claim 1, further comprising doping interior portions of the channel region of the fin structure using the first type of doping.

3. The method of claim 1, wherein the forming the first doped region comprises forming the first doped region using an ion implantation process.

4. The method of claim 1, wherein the first doped region and the fin structure have a same width measured along a direction perpendicular to a longitudinal direction of the fin structure.

5. The method of claim 1, wherein the second type of doping is P-type for an N-type transistor, or N-type for a P-type transistor.

6. The method of claim 1, wherein the source region and the drain region have a P-type doping, the exterior portions of the channel region has an N-type doping, and the first doped region has an N-type doping.

7. The method of claim 1, wherein an interior portion of the channel region of the fin structure is not doped.

8. The method of claim 1, further comprising forming a second doped region in the source region after the doping the source region and the drain region, wherein the second doped region has a same doping type as the source region.

9. The method of claim 8, wherein a dopant concentration of the second doped region is higher than a dopant concentration of the source region.

10. The method of claim 9, further comprising forming a source contact to the source region, wherein the second doped region is disposed between the source contact and the gate structure.

11. The method of claim 10, wherein the gate structure and second doped region are separated by a distance measured along a longitudinal direction of the fin structure, the distance ranging from about 10 nm to about 100 nm.

12. The method of claim 10, wherein the first doped region and the second doped region are symmetric about the gate structure, and wherein the source contact and the drain contact are symmetric about the gate structure.

13. A method of making a transistor, comprising:
   forming a fin structure protruding above isolation regions adjacent to the fin structure, the fin structure comprising a source region, a drain region, and a channel region interposed between the source region and the drain region;
   doping the source region and the drain region of the fin structure with a first dopant type;
   doping exterior surfaces of the channel region of the fin structure with a second dopant type different from the first dopant type;
   forming a gate structure over the channel region of the fin structure, wherein the drain region is on a first side of the gate structure, and the source region is on a second side of the gate structure opposing the first side;
   implanting a dopant of the second dopant type into a first doped region in the drain region; and
   forming a drain contact to the drain region of the fin structure, the first doped region being between the drain contact and the gate structure, the drain contact being surrounded by the drain region in a plan view, the drain region between the gate structure and the first doped region having a first concentration of the first dopant type, the drain region on an opposing side of the drain contact from the first doped region having a second concentration of the first dopant type, the first concentration being equal to the second concentration.

14. The method of claim 13, wherein the second dopant type is P-type for an N-type transistor, or N-type for a P-type transistor.

15. The method of claim 14, further comprising:
   implanting a dopant of the first dopant type into a second doped region in the source region, the second doped region having a higher dopant concentration than the source region; and forming a source contact to the source region of the fin structure, the second doped region being between the source contact and the gate structure.

16. The method of claim 13, wherein the fin structure has a height, the first doped region has a depth, wherein a ratio of the depth to the height ranges from about 10% to about 50%.

17. The method of claim 16, wherein the first doped region has a length between about 10 nm and about 100 nm measured along a longitudinal direction of the fin structure, wherein a distance between the first doped region and the gate structure ranges from about 20 nm to about 100 nm.

18. A method of forming a transistor comprising:

forming a fin structure above a substrate, the fin structure extending above an isolation structure around the fin structure;

forming a body region along an upper surface and sidewalls of a channel region of the fin structure using a first dopant having a first dopant type, wherein the channel region is between a source region and a drain region of the fin structure;

forming a gate structure overlying the body region, wherein the source region and the drain region are disposed on opposing sides of the gate structure;

doping the source region and the drain region using a second dopant having a second dopant type different from the first dopant type;

forming a first doped region in the drain region using a third dopant having the first dopant type, wherein the first doped region is spaced apart from the gate structure by a first distance;

forming a second doped region in the source region using a fourth dopant having the second dopant type, wherein the second doped region is spaced apart from the gate structure by a second distance, wherein a concentration of the second dopant type in the second doped region is higher than a concentration of the second dopant type in the source region, wherein the source region is disposed on opposing sides of the second doped region in a plan view;

forming a drain contact over an upper surface of the fin structure, the drain contact being electrically coupled to the drain region, wherein the first doped region is disposed between the gate structure and the drain contact in the plan view; and forming a source contact over the upper surface of the fin structure and electrically coupled to the source region, wherein the second doped region is disposed between the gate structure and the source contact in the plan view.

19. The method of claim 18, wherein a width of the first doped region measured along a longitudinal direction of the gate structure is less than a width of the fin structure.

20. The method of claim 18, wherein a third distance between the drain contact and the gate structure is equal to a fourth distance between the source contact and gate structure.

* * * * *